United States Patent [19]
Sato et al.

[11] Patent Number: 5,205,460
[45] Date of Patent: Apr. 27, 1993

[54] BONDING APPARATUS

[75] Inventors: Koji Sato; Akio Bando, both of Tokyo, Japan

[73] Assignee: Kabushiki Kaisha Shinkawa, Tokyo, Japan

[21] Appl. No.: 885,186

[22] Filed: May 19, 1992

[30] Foreign Application Priority Data

May 20, 1991 [JP] Japan .................................. 3-143927

[51] Int. Cl.⁵ .............................................. B23K 3/08
[52] U.S. Cl. ................................ 228/6.2; 228/44.7; 228/51; 15/21.1
[58] Field of Search ............... 228/6.2, 35, 44.7, 51, 228/57; 29/76.1, 81.05, 81.12; 15/236.1, 21.1, 28, 38, 39

[56]  References Cited

U.S. PATENT DOCUMENTS

| 4,321,738 | 3/1982 | Makhijani | 29/76.1 |
| 4,832,246 | 5/1989 | Ono et al. | 228/35 |
| 4,993,096 | 2/1991 | D'Amato | 15/21.1 |

FOREIGN PATENT DOCUMENTS

| 1404398 | 5/1965 | France | 15/21.1 |
| 116625 | 6/1984 | Japan | 15/21.1 |
| 60-246643 | 12/1985 | Japan | . |
| 321072 | 12/1989 | Japan | 228/57 |
| 3-32041 | 2/1991 | Japan | . |

Primary Examiner—Samuel M. Heinrich
Attorney, Agent, or Firm—Koda and Androlia

[57] ABSTRACT

A bonding apparatus for semiconductor devices, etc., including a bonding stage which places chips, etc. thereon, a bonding tool which press-bonds leads to the chips, etc., and a wire brush which is next to the bonding stage so as to clean the bonding tool. The wire brush is attached to the upper surface of a brush-rotating plate which is rotatable about its axis, and the brush-rotating plate is rotary-driven by a motor. A complete cleaning of all the side surfaces as well as the undersurface of the bonding tool is accomplished by bringing the bonding tool into contact with portions of the wire brush which are off the center of the rotating wire brush.

2 Claims, 2 Drawing Sheets

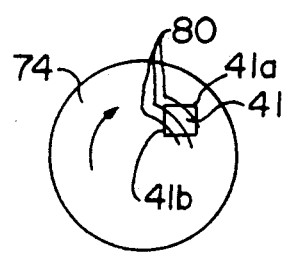
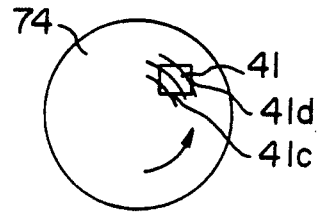
FIG. 2A  FIG. 2B
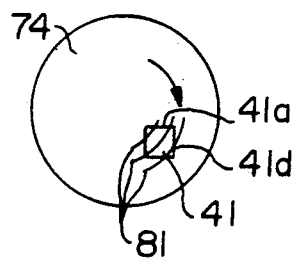
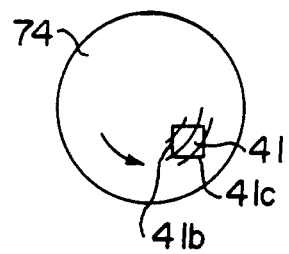
FIG. 3A  FIG. 3B

BONDING APPARATUS

BACKGROUND OF THE INVENTION

1. Field of the Invention

The present invention relates to a bonding apparatus and more particularly to a bonding apparatus with a bonding tool cleaning mechanism.

2. Prior Art

Currently, grindstones and wire brushes are used as a bonding tool cleaning means in bonding apparatuses such as an inner lead bonding apparatus, outer lead bonding apparatus, transfer bump bonding apparatus, chip bonding apparatus, etc.

Grindstones are suitable for removing substances adhering to the undersurface of the bonding tool; however, they do not remove the substances, which ar on the side surfaces of the bonding tool, well. On the other hand, wire brushes remove the substances adhering to the side surfaces of the bonding tool very efficiently, and they can also remove the substances adhering lightly to the undersurface of the bonding tool. Accordingly, the undersurface of the bonding tool is cleaned first by the grindstones, and then the side surfaces and the undersurface of the bonding tool are further cleaned with wire brushes.

Examples of conventional bonding apparatuses that use wire brushes are disclosed in Japanese Patent Application Laid-Open ("Kokai") Nos. 60-246643 (called "Conventional Example 1") and No. 3-32041 (called "Conventional Example 2" which corresponds to the U.S. patent application No. 07/616,194).

In Conventional Example 1, a wire brush is provided on the outer surface of a cylindrical ring. The cylindrical ring is installed so that its axis is oriented horizontally, and bonding tool cleaning is performed by rotating the ring. In Conventional Example 2, a wire brush is installed on a cleaning stand, and bonding tool cleaning is done by moving the cleaning stand horizontally by an X-Y table.

More specifically, since in Conventional Example 1 the cylindrical ring is installed horizontally, the brush on the rotating cylindrical ring can clean only the side surfaces of the bonding tool. In other words, although two opposite side surfaces of the bonding tool can be cleaned by the wire brush rotating in the forward and reverse directions, the remaining two side surfaces of the bonding tool are not cleaned. Furthermore, the undersurface of the bonding tool is cleaned only in the direction of rotation of the wire brush, and no cleaning is performed in the direction perpendicular to the direction of rotation of the wire brush. Thus, cleaning efficiency is not very satisfactory.

In Conventional Example 2, the wire brush does not rotate. Instead, bonding tool cleaning is accomplished by moving the cleaning stand on a horizontal plane. Accordingly, only the undersurface of the bonding tool is cleaned, and the side surfaces are not cleaned well. Thus, complete cleaning cannot be accomplished, and the cleaning efficiency tends to be poor.

SUMMARY OF THE INVENTION

Accordingly, the object of the present invention is to provide a bonding apparatus with a bonding tool cleaning mechanism that accomplishes the cleaning of the entire side surfaces as well as the undersurface of the bonding tool, thus improving cleaning efficiency.

In order to accomplish the objects, the present invention takes a unique structure for a bonding apparatus that includes a bonding stage that places chips, etc. thereon, a bonding tool that press-bonds the chips, etc. to the leads on a film carrier, and a wire brush that is installed near the bonding stage to clean the bonding tool, and the unique structure of the present invention is that the wire brush is provided on the upper surface of a rotary-brush element which is rotatable in two opposite directions so that the bonding tool is brought into contact with this rotary-brush.

The wire brush rotates about its central axis in the forward and reverse directions. Accordingly, when the bonding tool is brought into contact with different portions of the rotating wire brush which are somewhat away from the center of rotation of the wire brush, the four side surface of the bonding tool are cleaned by the rotating wire brush. By switching around the positions where the bonding tool is in contact with the rotating wire brush and by changing the depth of the bonding tool into the wire brush, the undersurface of the bonding tool is cleaned from two perpendicularly different directions. Accordingly, the undersurface of the bonding tool can be cleaned entirely. In addition, since the cleaning is accomplished by a rotating wire brush, the cleaning efficiency is high.

BRIEF DESCRIPTION OF THE DRAWING

FIGS. 2(*a*) and 2(*b*) illustrate the positional relationship between the wire brush and the bonding tool of the bonding apparatus of the present invention wherein FIG. 2(*a*) shows the wire brush rotating forwardly and FIG. 2(*b*) shows the wire brush rotating reversely;

FIGS. 3(*a*) and 3(*b*) show another positional relationship between the wire brush and the bonding tool which is different from FIG. 2 wherein FIG. 3(*a*) shows the wire brush rotating forwardly and FIG. 3(*b*) reversely.

DETAILED DESCRIPTION OF THE INVENTION

Figure 1:
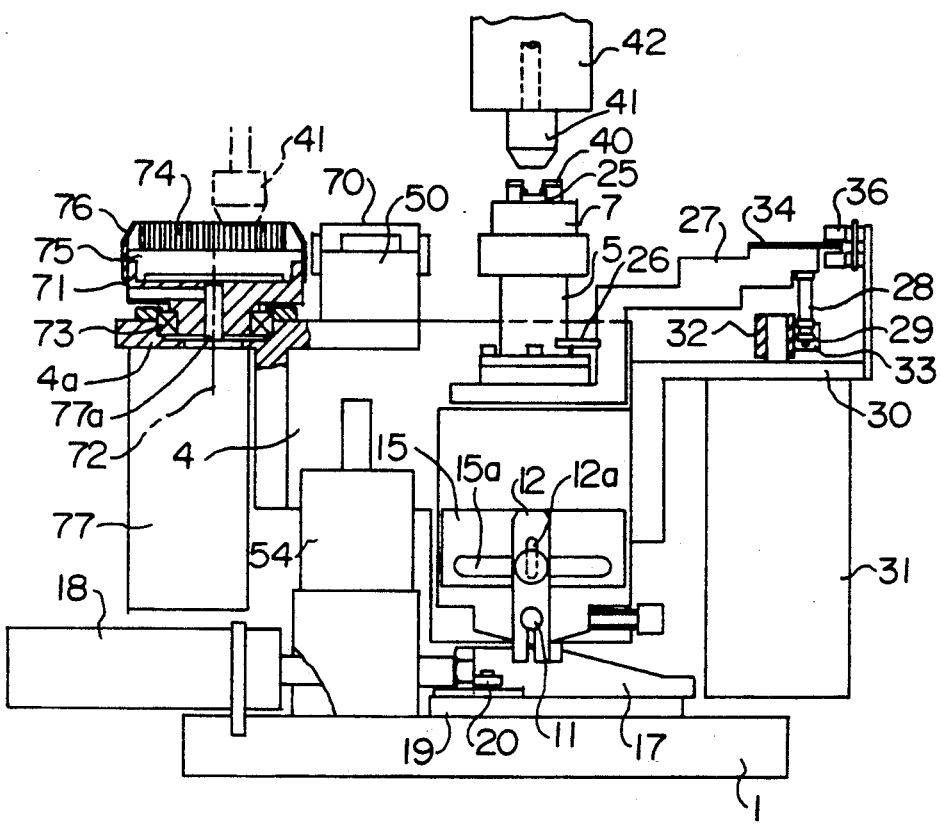
FIG. 1 is a partially cross-sectional front view of the bonding apparatus of the present invention.

One embodiment of the present invention will be described below with reference to FIG. 1. The structure of the cleaning mechanism will be described first.

A cleaning stand 50 is provided on top of the cleaning section 4*a* of a vertically movable block 4. A grindstone 70 is installed on the upper surface of this cleaning stand 50.

On the cleaning section 4*a*, a brush-rotating plate 71 is supported via a bearing 73. The brush-rotating plate 71 is rotatable about its vertical axis 72.

A brush-holding plate 75 is provide with a wire brush 74 and is mounted on the upper surface of the brush-rotating plate 71. The wire brush 74 is surrounded by a cover ring 76 which is secured to the brush-rotating plate 71.

A motor 77 which makes forward and reverse rotations is installed in the cleaning section 4*a*, and the brush-rotating plate 71 is coupled to the output shaft 77*a* of the motor 77.

The cleaning mechanism described above is used in an inner bonding apparatus of, for example, Conventional Example 2. The bonding apparatus operates in the following manner when leads 40 installed on a film carrier are bonded to a chip 25.

After the chip 25 is placed on a bonding stage 7 which positions and carries chips, etc. thereon, the chip 25 is held on the bonding stage 7 by vacuum suction which is effected through vacuum holes of the bonding stage 7. The position of the chip 25 is detected by a camera (not shown), and the rotational position of the chip 25 relative to the leads 40 is corrected by motor 31.

More specifically, when the motor 31 rotates, the roller 29, roller shaft 28 and adjustment lever 27 are rotated about the axis of the stage supporting shaft 5 via a rotating block 32 (which is coupled to the output shaft of the motor 31) and roller 29, and the stage supporting shaft 5 is also rotated. With these movements, an adjustment of the chip 25 in its rotational direction is accomplished. The adjustment of the chip 25 in the X-Y direction relative to the leads 40 is made by the X-Y table 1 which is driven in the X and Y directions.

Next, the bonding tool holder 42 is moved up and down and also in the X and Y directions by a driving means (not shown), and then the bonding tool 41 which is held by the bonding tool holder 42 is lowered.

The air cylinder 18 is actuated, and the bonding stage 7 is raised, thus bringing the leads 40 into contact with the chip 25. More specifically, when the air cylinder 18 is thus actuated, the vertically movable block 4 is moved up and down by a cam follower (not shown) which is installed on the vertically movable block 4 and in contact with the linear cam 17. As a result, the bonding stage 7 is raised and lowered. After the leads 40 are bonded to the chip 25, the bonding tool 41 is raised and the bonding stage 7 is lowered.

In FIG. 1, reference numeral 11 denotes an eccentric shaft, 12 an adjustment screw, 13 a lock screw with its shaft portion inserted into the vertical slot 12a of the adjustment screw 12, 15 a supporting plate which is fastened to the vertically movable block 4, 19 a guide block which guides the linear cam 17, 20 a guide roller which is rotatably supported on the guide block 19, 30 a motor bracket which is fastened to the vertically movable block 4, 34 a detection plate, 36 a photosensor, and 54 denotes a piston-cylinder.

The operation of the bonding tool cleaning mechanism of the present invention which is incorporated in the bonding apparatus described above will be described in detail below.

After the operation to bond each of the leads 40 to the chip 25 for a prescribed number of times, the bonding tool 41 is moved above the grindstone 70. Then, the piston-cylinder 54 is actuated so that the cleaning section 4a of the vertically movable block 4 is slightly pushed upward. Then, the bonding tool 41 is lowered, so that the undersurface of the bonding tool 41 comes into contact with the grindstone 70. Next, the X-Y table 1 is driven back and forth for a predetermined period of time in the X and Y directions. The undersurface of the bonding tool 41 is thus cleaned.

After this cleaning, the bonding tool 41 is raised, and the X-Y table 1 is driven to bring the wire brush 74 beneath the bonding tool 41. The motor 77 is started and the wire brush 74 is caused to rotate about its vertical center axis 72 via the brush-rotating plate 71. Then, the bonding tool 41 is lowered in order to come into contact with this rotating wire brush 74. As a result, substances adhering to the side surfaces and undersurface of the bonding tool 41 are removed by the wire brush 74.

The cleaning action of the bonding tool 41 by the wire brush 74 will be described below with reference to FIGS. 2 and 3.

The bonding tool 41 is brought to contact with a portion of the wire brush 74 where the bonding tool 41 is somewhat away from the vertical center axis 72 of the wire brush 74. In other words, the bonding tool 41 is off the center of the wire brush plate 74. When the wire brush 74 is rotated in the forward direction as shown in FIG. 2(a), two side surface 41a and 41b of the bonding tool 41 are cleaned. When the wire brush 74 is rotated in the reverse direction as shown in FIG. 2(b), the remaining two side surfaces 41c and 41d of the bonding tool 41 are cleaned.

In other words, all four side surfaces 41a through 41d of the bonding tool 41 are cleaned by changing the direction of the rotation of the wire brush 74.

Furthermore, if the position where the bonding tool 41 contacts the wire brush 74 is switched as shown in FIG. 3, then the two side surfaces 41a and 41c are cleaned when the wire brush 74 is caused to rotate in the forward direction as shown in FIG. 3(a), and the remaining two side surfaces 41b and 41c are cleaned by the wire brush 74 rotating in the reverse direction as shown in FIG. 3(b).

When the cleaning is done as shown in FIG. 2(a), the surface 41a is cleaned more than the surface 41b; and in the case of FIG. 2(b), the surface 41d is cleaned more than the surface 41c. On the other hand, when the cleaning is performed as shown in FIG. 3(a), the surface 41d is cleaned more than the surface 41a; and in the case of FIG. 3(b), the surface 41c is cleaned more than the surface 41b.

Accordingly, by moving the bonding tool 41 around so that it contacts the brush at four different positions as shown in FIGS. 2 and 3, the four sides of the bonding tool are cleaned evenly.

As to the undersurface of the bonding tool 41, the cleaning is performed in the direction shown by arrow 80 when the bonding tool is set as in FIG. 2 and in the direction shown by arrow 81 which is the direction perpendicular to the direction of arrow 80 when the bonding tool is set as in FIG. 3. In other words, by combining two different cleaning directions as shown in FIGS. 2 and 3, the undersurface of the bonding tool 41 is cleaned from two perpendicularly different directions. Thus, the cleaning efficiency of the undersurface of the bonding tool is high.

As seen from the above, according to the present invention, since the wire brush 74 rotates in two opposite directions about its center axis 72, all four side surfaces 41a through 41d of the bonding tool 41 are cleaned by positioning the bonding tool 41 at the off-the-center portions of the rotating wire brush 74.

Furthermore, since the cleaning is performed by rotating the wire brush, the cleaning is accomplished in a shorter period of time. In addition, more efficient cleaning of the side surfaces and undersurface of the bonding tool 41 is performed by merely switching the positions where the bonding tool 41 is in contact with the wire brush 74 and by changing the direction of rotation of the wire brush.

In the above embodiment, a single grindstone 70 is used. However, the present invention is applicable for a bonding apparatus which uses two or more grindstones. Also, it is possible to use only the wire brush 74 and not the grindstones.

Moreover, in the above embodiment, the cleaning section 4a is provided on the vertically movable block 4. However, the cleaning section 4a can be a separate unit from the vertically moving block 4 so that the cleaning section 4a is driven by a separate X-Y table which is different from the X-Y table 1. In addition, the above description is made relative to an inner bonding apparatus; however, it goes without saying that the present invention can be applicable to a bonding apparatus for outer leads bonding or transfer chip systems, etc.

As is evident from the above, in the present invention, since the wire brush rotates about its vertical center axis, all four side surfaces of the bonding tool are cleaned by bringing the bonding tool into contact with off-the-center portions of the rotating wire brush. Furthermore, since the cleaning is accomplished by rotating the wire brush, the cleaning is accomplished in a short period of time.

We claim:

1. A semiconductor bonding apparatus comprising:
   a bonding stage which positions and carries a chip thereon;
   a bonding tool which press-bonds said chip to leads of a film carrier, and
   a wire brush installed adjacent to said bonding stage such that a longitudinal axis of said wire brush is displaced from a center of said bonding tool for cleaning said bonding tool;
   wherein said wire brush is attached to an upper surface of a brush-rotating section which is supported so as to be rotatable about its vertical axis, and said brush-rotating section being rotary-driven by a rotary driving means.

2. A semiconductor bonding apparatus with a horizontally and vertically movable bonding tool and a vertically movable bonding tool cleaning means, said cleaning means comprising:
   a brush-rotating plate rotatable about its center axis;
   a brush-holding plate fixed on said brush-rotating plate; and
   a wire brush provided on a top surface of said brush-holding plate, said bonding tool being moved so as to come into contact with a portion of said wire brush which is displaced from a center-axis of said bonding tool.

* * * * *